United States Patent
Park et al.

(10) Patent No.: US 10,074,334 B2
(45) Date of Patent: Sep. 11, 2018

(54) DRIVING UNIT AND DISPLAY DEVICE HAVING THE SAME

(71) Applicant: Samsung Display Co., Ltd., Yongin-Si, Gyeonggi-Do (KR)

(72) Inventors: Haeng-Won Park, Seongnam-si (KR); Seung-Hwan Moon, Yongin-si (KR); Nam-Soo Kang, Ansan-si (KR); Sung-Jae Moon, Seoul (KR); Sung-Man Kim, Seoul (KR); Seong-Young Lee, Seoul (KR); Yong-Soon Lee, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/601,026

(22) Filed: May 22, 2017

(65) Prior Publication Data

US 2017/0256226 A1   Sep. 7, 2017

Related U.S. Application Data

(62) Division of application No. 11/230,112, filed on Sep. 19, 2005, now Pat. No. 9,659,542.

(30) Foreign Application Priority Data

Sep. 18, 2004   (KR) .................. 10-2004-0074797

(51) Int. Cl.
*G09G 3/36* (2006.01)
*G11C 19/18* (2006.01)

(52) U.S. Cl.
CPC ......... *G09G 3/3677* (2013.01); *G11C 19/184* (2013.01); *G09G 2300/0426* (2013.01)

(58) Field of Classification Search
CPC ......... G09G 3/3677; G09G 2300/0426; G11C 19/184
See application file for complete search history.

(56) References Cited

U.S. PATENT DOCUMENTS 6,300,928 B1   10/2001   Kim
6,845,140 B2    1/2005   Moon et al.
(Continued)

FOREIGN PATENT DOCUMENTS

JP   10124009 A    5/1998
JP   10276080 A   10/1998
(Continued)

OTHER PUBLICATIONS

Office Action from Chinese Patent Office dated Feb. 1, 2008 with English Translation.

*Primary Examiner* — Carolyn R Edwards
(74) *Attorney, Agent, or Firm* — Cantor Colburn LLP (57) ABSTRACT

A gate driver includes multiple stages. Each stage has a circuit portion and a wiring portion. The wiring portion delivers first and second clock signals to the circuit portion. Further, the wiring portion includes first and second clock wirings receiving the first and second clock signal, respectively, first connecting wirings electrically connecting the first clock wiring with a first every other stage, and second connecting wirings electrically connecting the second clock wiring with the odd-numbered stages. Further, the wiring portion includes third connecting wirings electrically connecting the first connecting wiring with a second every other stage and fourth connecting wirings electrically connecting the second connecting wiring with the even-numbered stages. This configuration may prevent the gate driver from operating erroneously and reduce power consumed by the gate driver.

8 Claims, 9 Drawing Sheets

(56) References Cited

U.S. PATENT DOCUMENTS

| | | | |
|---|---|---|---|
| 6,970,530 B1 * | 11/2005 | Wang | G11C 19/282 345/100 |
| 7,203,264 B2 | 4/2007 | Lo et al. | |
| 7,289,594 B2 | 10/2007 | Moon | |
| 2003/0227433 A1 * | 12/2003 | Moon | G09G 3/3677 345/100 |
| 2003/0231735 A1 | 12/2003 | Moon et al. | |

FOREIGN PATENT DOCUMENTS

| | | |
|---|---|---|
| JP | 11176186 A | 7/1999 |
| KR | 1020040070537 A | 8/2004 |
| TW | 200401257 | 1/2004 |
| TW | 200406636 | 5/2004 |
| WO | 03087921 A2 | 10/2003 |
| WO | 03107314 A2 | 12/2003 |

* cited by examiner

FIG. 9

DRIVING UNIT AND DISPLAY DEVICE HAVING THE SAME

This application is a divisional of U.S. patent application Ser. No. 11/230,112, filed on Sep. 19, 2005, which claims priority to Korean Patent Application No. 10-2004-0074797 filed on Sep. 18, 2004, the contents of which are herein incorporated by reference in its entirety.

BACKGROUND OF THE INVENTION

1. Field of the Invention

The present invention relates to a driving unit and a display device having the same, and more particularly, to a driving unit having a reduced number of contact electrodes, and a display device having the same, thereby preventing malfunction thereof.

2. Description of the Related Art

Generally, a display device includes a display panel, gate drivers outputting gate signals for driving the display panel, and data drivers outputting data signals to the display panel. The gate and data drivers are integrated circuits, for example, and are affixed to the display panel. However, there is a recent tendency that the gate drivers are formed on the display panel for reducing failure of the display device while affixing the gate driver to the display panel.

Figure 1:
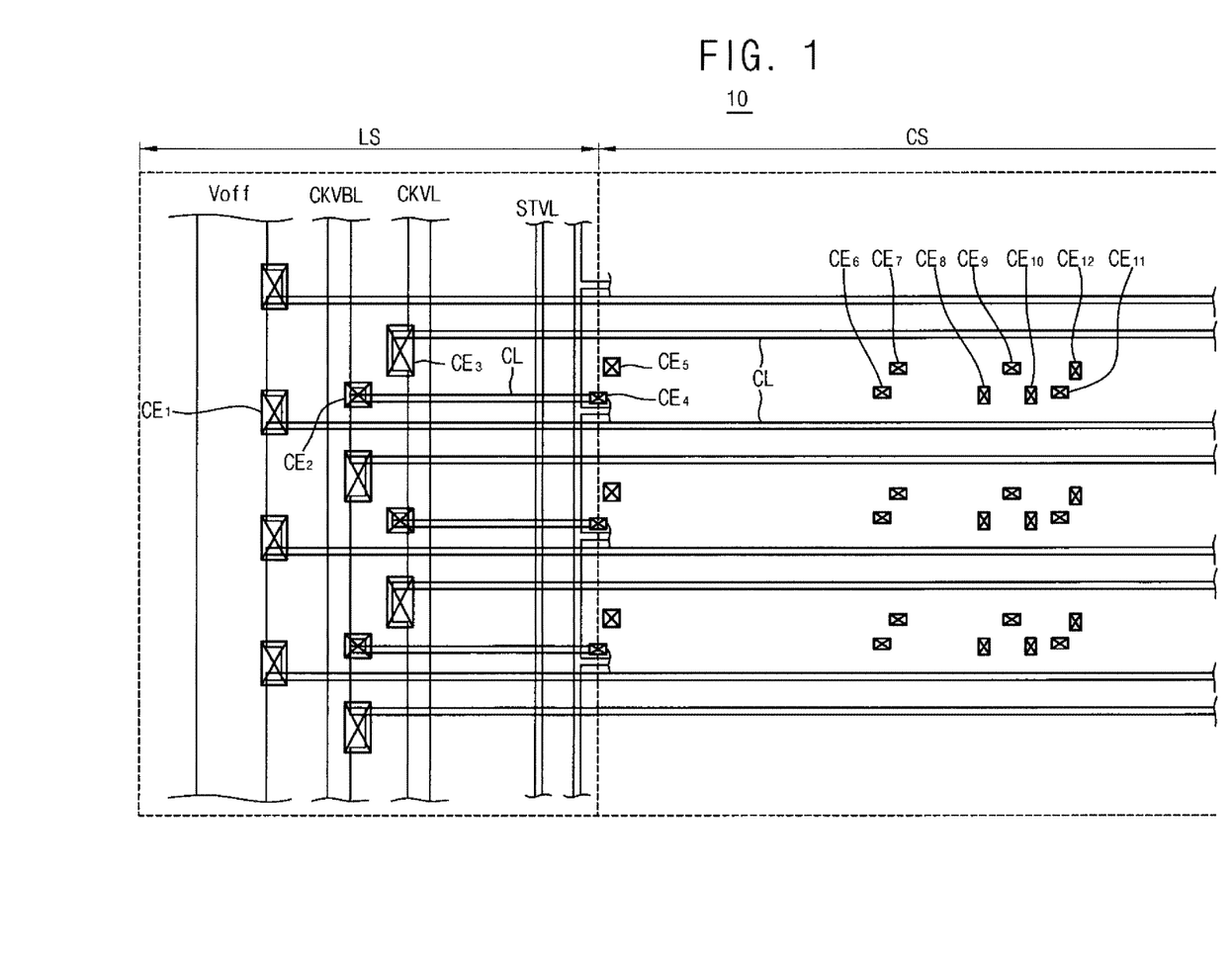
FIG. 1 is a layout diagram of a conventional gate driver.

FIG. 1 is a layout diagram of a conventional gate driver formed on the display panel. As shown in FIG. 1, the gate driver 10 includes a wiring portion LS delivering control signals from an external device (not shown) and a circuit portion CS outputting gate output signals in response to the control signals of the wiring portion LS. The circuit portion CS has a shift register that includes multiple stages connected one after another and to each other.

The wiring portion LS includes a vertical synchronization start signal wiring STVL, a clock wiring CKVL, a clock-bar wiring CKVBL, and an off voltage wiring VoffL. The wiring portion LS further includes connecting wirings CL for electrically connecting the vertical synchronization start signal wiring STVL, the clock wiring CKVL, the clock-bar wiring CKVBL, and the off voltage wiring VoffL to the circuit portion CS. This configuration causes parasitic capacitances between the connecting wirings CL and the vertical synchronization start signal wiring STVL, the clock wiring CKVL, the clock-bar wiring CKVBL, and the off voltage wiring VoffL, respectively, and therefore a consumed power of the display device is increased. In other words, the consumed power P follows $P = f \times C_p \times \Delta V^2$ (Herein, f is a frequency, Cp is a parasitic capacitance, and $\Delta V^2$ is an amplitude of the applied voltage). The parasitic capacitance Cp is proportional to the consumed power, and therefore, the consumed power increases as the parasitic capacitance increases.

Generally, amplitudes of ΔV of the clock and clock-bar signals each supplied from the clock and clock-bar wirings CKVL and CKVBL, respectively, are about 30V. Therefore, the connecting wirings CL electrically connecting the clock and clock-bar wirings CKVL and CKVBL to the circuit portion CS also increase the consumed power P.

Meanwhile, since the connecting wirings CL are formed on a layer different from the vertical synchronization start signal wiring STVL, the clock wiring CKVL, the clock-bar wiring CKVBL, and the off voltage wiring VoffL, each connecting wiring CL is connected to the vertical synchronization start signal wiring STVL, the clock wiring CKVL, the clock-bar wiring CKVBL, and the off voltage wiring VoffL through multiple contact electrodes CE1, CE2, CE3, CE4, CE5, CE6, CE7, CE8, CE9, CE10, CE11 and CE12. This results in eroding the gate drivers 10 at the contact electrodes CE1 to CE12 and therefore causing malfunction of the gate drivers 10.

SUMMARY OF THE INVENTION

The present invention provides a driving unit capable of preventing malfunction by erosion at the contact electrodes and a display device having the same.

In exemplary embodiments, the driving unit comprises a circuit portion, the circuit portion comprises a plurality of stages, the plurality of stages generate output signals according to at least one of first and second clocks; and a wiring portion, the wiring portion delivers control signals to the circuit portion, the wiring portion comprises first and second clock wirings, the first and second clock wirings deliver the first and second clock, respectively; first connecting wirings, the first connecting wirings connect the first clock wiring with a first every other stage; second connecting wirings, the second connecting wirings connect the second clock wiring with a second every other stage different from the first every other stage; third connecting wirings, the third connecting wirings connect the first connecting wiring with the plurality of stages; and fourth connecting wirings, the fourth connecting wirings connect the second connecting wiring with the plurality of stages.

In exemplary embodiments, a display device comprises a display panel, the display panel displays images in response to gate and data signals; a data driving portion, the data driving portion supplies the data signals to the display panel; and a gate driving portion, the gate driving portion supplies the gate signals to the display panel and comprises a circuit portion, the circuit portion comprises a plurality of stages, the plurality of stages generate output signals according to at least one of first and second clocks; and a wiring portion, the wiring portion delivers control signals to the circuit portion, the wiring portion comprises first and second clock wirings, the first and second clock wirings deliver the first and second clock, respectively; first connecting wirings, the first connecting wirings connect the first clock wiring with a first every other stage; second connecting wirings, the second connecting wirings connect the second clock wiring with a second every other stage different from the first every other stage; third connecting wirings, the third connecting wirings connect the first connecting wiring with the plurality of stages; and fourth connecting wirings, the fourth connecting wirings connect the second connecting wiring with the plurality of stages.

These and other objects, features and advantages of the present invention will become apparent from the following detailed description of embodiments thereof, which is to be read in connection with the accompanying drawings.

BRIEF DESCRIPTION OF THE DRAWINGS

The above and other features and advantage points of the present invention will become more apparent by describing in detailed embodiments thereof with reference to the accompanying drawings, in which.

DETAILED DESCRIPTION OF THE INVENTION

Hereinafter the embodiments of the present invention will be described in detail with reference to the accompanied drawings.

Figure 2:
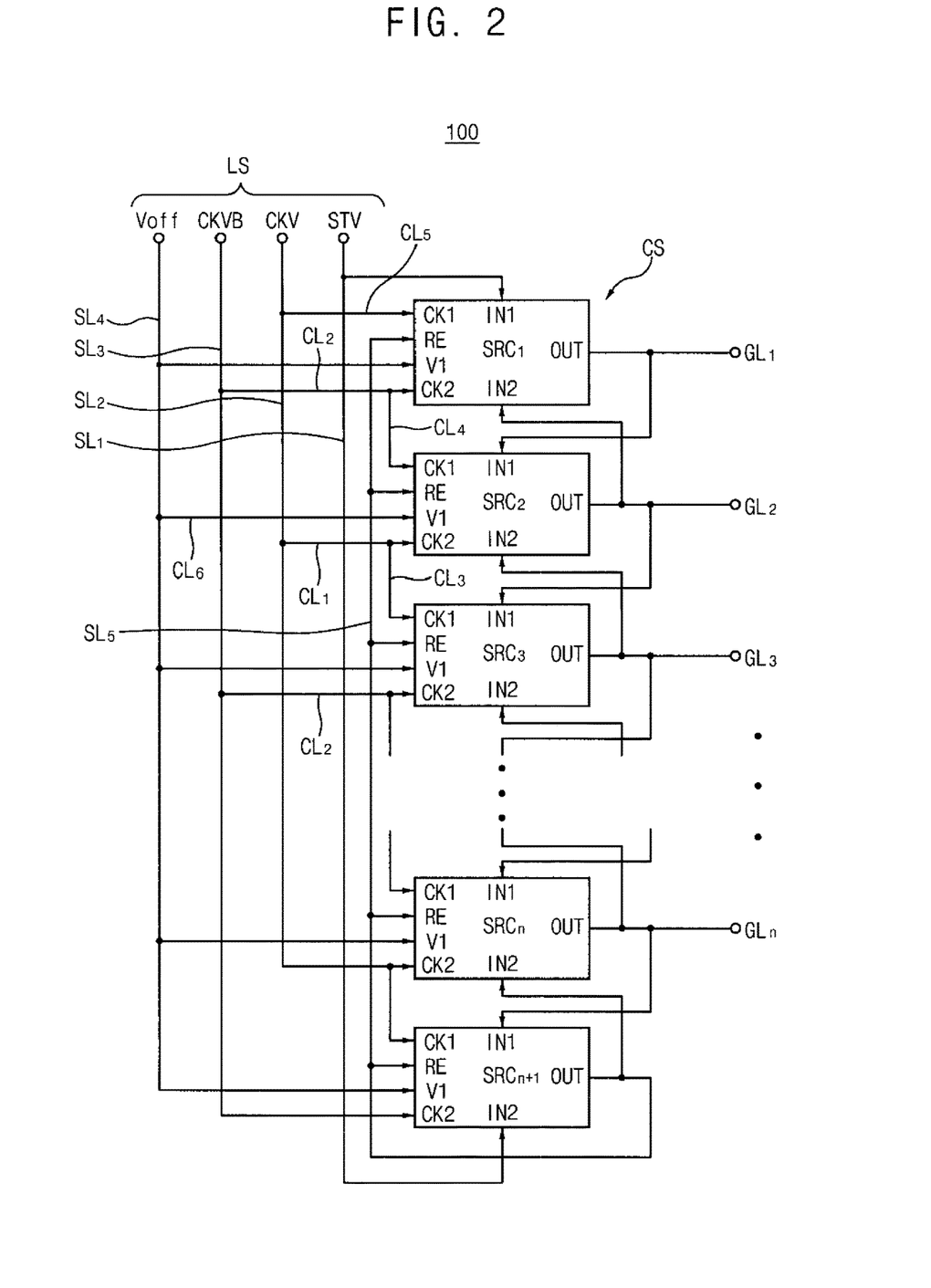
FIG. 2 is a block diagram of a gate driver according to an exemplary embodiment.

FIG. 2 is a block diagram of a gate driver 100 according to an exemplary embodiment. Referring to FIG. 2, the gate driver 100 includes a circuit portion CS outputting gate output signals and a wiring portion LS delivering gate control signals to the circuit portion CS.

The circuit portion CS includes first, second, . . . , (n+1)th stages SRC1, SRC2, . . . , SRC(n+1) (wherein, n is an even number). The first, second, . . . , (n+1)th stages SRC1, SRC2, . . . , SRC(n+1) include a first clock terminal CK1, a second clock terminal CK2, a first input terminal IN1, a second input terminal IN2, a voltage terminal V1, a reset terminal RE, and an output terminal OUT. The first clock terminal CK1 of each of the odd-numbered stages SRC1, SRC3, . . . , SRC(n+1) is operatively coupled to a first clock CKV, and the first clock terminal CK1 of each of the even-numbered stages SRC2, SRC4, . . . , SRCn is operatively coupled to a second clock CKVB. The first and second clocks CKV and CKVB have a 180° phase difference, for example. Meanwhile, the second clock terminal CK2 of each of the odd-numbered stages SRC1, SRC3, . . . , SRC(n+1) is operatively coupled to the second clock CKVB, and the second clock terminal CK2 of each of the even-numbered stages SRC2, SRC4, . . . , SRCn is operatively coupled to the first clock CKV.

The first input terminal IN1 of the first stage SRC1 receives a vertical synchronization start signal STV, and the second input terminal IN2 of the (n+1)th stage SRC(n+1) which is a dummy stage also receives the vertical synchronization start signal STV. The (n+1)th stage SRC(n+1) supplies a (n+1)th gate output signal to the second input terminal IN2 of the nth stage SRCn. Further, the voltage terminals V1 of the first, second, . . . , (n+1)th stages SRC1, SRC2, . . . , SRC(n+1), respectively, receive an off voltage Voff. The off voltage Voff has a certain voltage, for example, about −5 to about −7V. The reset terminals RE of the first, second, . . . , (n+1)th stages SRC1, SRC2, . . . , SRC(n+1), respectively, receive the (n+1)th gate output signal of the (n+1)th stage SRC(n+1).

The output terminals OUT of each of the odd-numbered stages SRC1, SRC3, . . . , SRC(n+1) output a high level of the first clock CKV, and the output terminals OUT of each of the even-numbered stages SRC2, SRC4, . . . , SRCn output a high level of the second clock CKVB. Accordingly, the first, second, . . . , (n+1)th stages SRC1, SRC2, . . . , SRC(n+1), respectively, output first, second, . . . , (n+1)th gate output signals, respectively.

The wiring portion LS receives gate control signals from an external device (not shown) and delivers the gate control signals to the circuit portion CS. The wiring portion LS includes a start signal wiring SL1, a first clock wiring SL2, a second clock wiring SL3, an off voltage wiring SL4, and a reset wiring SL5. The reset wiring SL5 is formed adjacent to the circuit portion CS; the off voltage wiring SL4 is formed adjacent to the reset wiring SL5; the second clock wiring SL3 is formed adjacent to the off voltage wiring SL4; the first clock wiring SL2 is formed adjacent to the second clock wiring SL3; and the start signal wiring SL1 is formed adjacent to the first clock wiring SL2, as illustrated in FIG. 2.

The start signal wiring SL1 delivers the vertical synchronization start signal STV to the first input terminal IN1 of the first stage SRC1 and to the second input terminal IN2 of the (n+1)th stage SRC(n+1). Herein, the vertical synchronization start signal STV starts operation of the circuit portion CS.

The first clock wiring SL2 delivers the first clock CKV to the first clock terminal CK1 of each of the odd-numbered stages SRC1, SRC3, . . . , SRC(n+1) and to the second clock terminal CK2 of each of the even-numbered stages SRC2, SRC4, . . . , SRCn. The second clock wiring SL3 delivers the second clock CKVB to the second clock terminal CK2 of each of the odd-numbered stages SRC1, SRC3, . . . , SRC(n+1) and to the first clock terminal CK1 of each of the even-numbered stages SRC2, SRC4, . . . , SRCn. The off voltage wiring SL4 delivers an off voltage Voff to the voltage terminal V1 of the first, second, . . . , (n+1)th stages SRC1, SRC2, . . . , SRC(n+1), respectively. The reset wiring SL5 delivers the (n+1)th gate output signal of the (n+1)th stage SRC(n+1) to the reset terminal RE of the first, second, . . . , nth stages SRC1, SRC2, . . . , SRCn, respectively.

Further, the wiring portion LS includes first, second, third, and fourth connecting wirings CL1, CL2, CL3 and CL4. The first connecting wirings CL1 electrically connect the first clock wiring SL2 with the second clock terminals CK2 of each of the even-numbered stages SRC2, SRC4, . . . , SRCn. Accordingly, the first connecting wirings CL1 deliver the first clock CKV to the second clock terminals CK2 of each of the even-numbered stages SRC2, SRC4, . . . , SRCn.

The second connecting wirings CL2 electrically connect the second clock wiring SL3 with the second clock terminals CK2 of each of the odd-numbered stages SRC1, SRC3, . . . , SRC(n+1). Accordingly, the second connecting wirings CL3 deliver the second clock CKVB to the second clock terminals CK2 of each of the odd-numbered stages SRC1, SRC3, . . . , SRC(n+1).

The third connecting wirings CL3 electrically connect the first connecting wiring CL1 with the first clock terminals CK1 of each of the odd-numbered stages SRC3, SRC5, . . . , SRC(n+1). Accordingly, the third connecting wirings CL3 deliver the first clock CKV to the first clock terminals CK1 of each of the odd-numbered stages SRC3, SRC5, . . . , SRC(n+1) except the first stage SRC1.

The fourth connecting wirings CL4 electrically connect the second connecting wiring CL2 with the first clock terminals CK1 of each of the even-numbered stages SRC2, SRC4, . . . , SRCn. Accordingly, the fourth connecting wirings CL4 deliver the second clock CKVB to the first clock terminals CK1 of each of the odd-numbered stages SRC3, SRC5, . . . , SRC(n+1). Meanwhile, the wiring portion LS further includes a fifth connecting wiring CL5. The fifth connecting wiring CL5 electrically connects the first clock wiring SL2 with the first clock terminal CK1 of the first stage SRC1. The wiring portion LS further includes sixth connecting wirings CL6. The sixth connecting wirings CL6 electrically connect the fourth clock wiring SL4 with the voltage terminals V1 of each of the stages.

Figure 3:
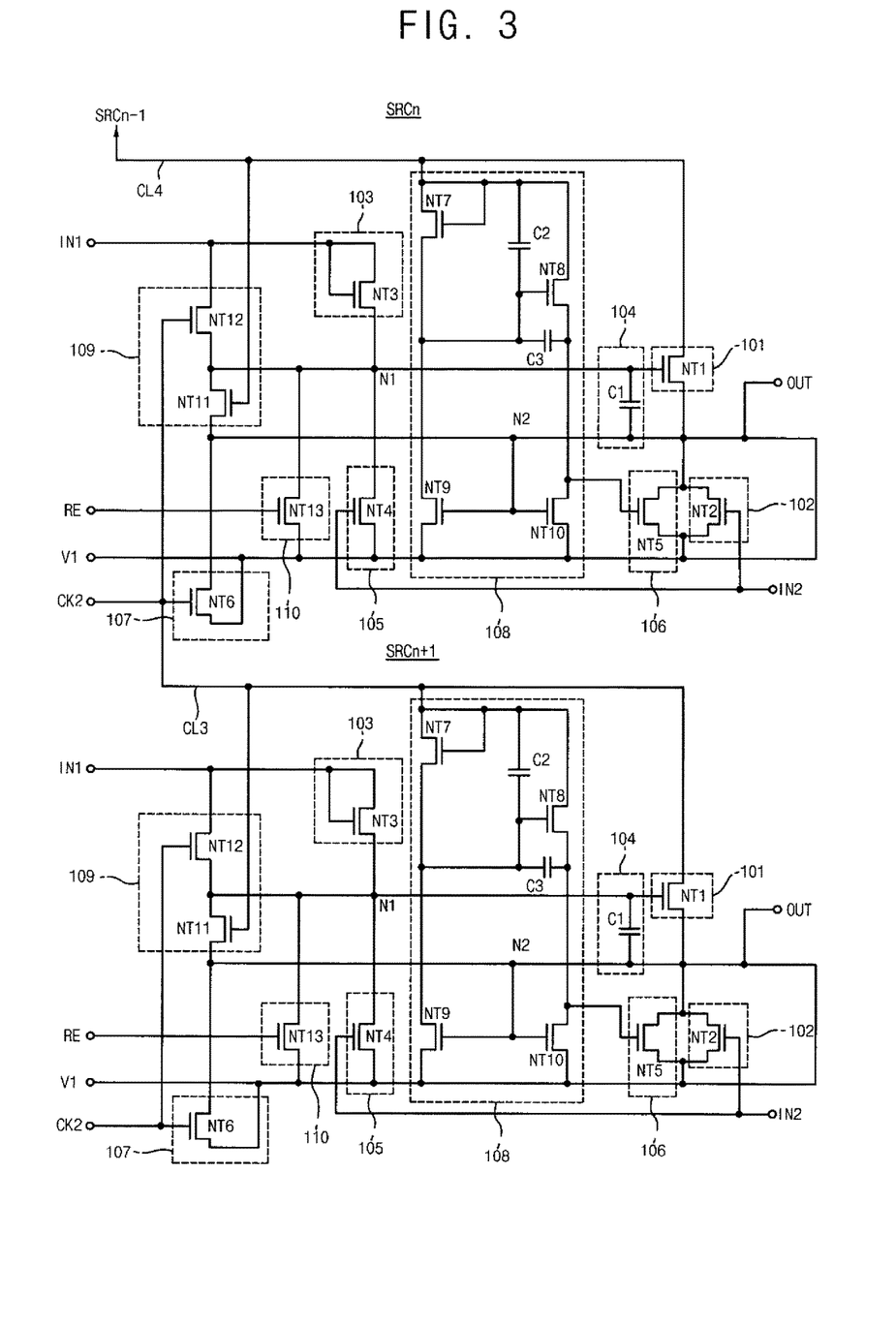
FIG. 3 is a circuit diagram of nth and (n+1)th stages in FIG. 2.

FIG. 3 is a circuit diagram of the nth and (n+1)th stages, SCRn and SCRn+1, respectively, in FIG. 2. Referring to FIG. 3, the nth stage SRCn includes a pull-up portion 101 and a pull-down portion 102. The pull-up portion 101 controls a nth gate output signal of the nth stage SRCn by the second clock CKVB and the pull-down portion 102 discharges the nth gate output signal by a (n+1)th gate output signal of the (n+1)th stage SRC(n+1).

The pull-up portion 101 includes a first transistor NT1. A gate electrode of the first transistor NT1 is connected to a first node N1; a drain electrode of the first transistor NT1 is connected to the fourth connecting wiring CL4; and a source electrode of the first transistor NT1 is connected to the output terminal OUTn. Accordingly, the drain electrode of the first transistor NT1 receives the second clock CKVB through the fourth connecting wiring CL4. The pull-down portion 102 includes a second transistor NT2. A gate electrode of the second transistor NT2 is connected to the second input terminal IN2; a drain electrode of the second transistor NT2 is connected to the output terminal OUTn; and a source electrode of the second transistor NT2 is connected to the voltage terminal V1.

The nth stage SRCn further includes a pull-up driving portion which comprises a buffer portion 103, a charging portion 104, and a first discharging portion 105. The pull-up driving portion turns on the pull-up portion 101 in response to the (n−1)th gate output signal of the (n−1)th stage SRC(n−1) and turns off the pull-up portion 101 in response to the (n+1)th gate output signal of the (n+1)th stage SRC(n+1).

The buffer portion 103 includes a third transistor NT3. Gate and drain electrodes of the third transistor NT3 are commonly connected to the first input terminal IN1, and a source electrode of the third transistor NT3 is connected to the first node N1. The charging portion 104 includes a first capacitor C1. First and second electrodes of the first capacitor C1 are connected to the first and second nodes N1 and N2, respectively. The first discharging portion 105 includes a fourth transistor NT4, and a gate electrode of the fourth transistor NT4 is connected to the second input terminal IN2; a drain electrode of the fourth transistor NT4 is connected to the first node N1; and a source electrode of the fourth transistor NT4 is connected to the voltage terminal V1. Accordingly, when the third transistor NT3 is turned on in response to the (n−1)th gate output signal of the (n−1)th stage SRC(n−1), the (n−1)th gate output signal of the (n−1)th stage SRC(n−1) is charged in the first capacitor C1 of the charging portion 104. Then, when a voltage more than a threshold voltage of the first transistor NT1 is charged in the first capacitor C1, the first transistor NT1 is bootstrapped and therefore a high level of the second clock CKVB supplied from the (n−1)th stage SRC(n−1) is outputted to the output terminal OUTn. Then, when the fourth transistor NT4 is turned on in response to the (n+1)th gate output signal of the (n+1)th stage SRC(n+1), electric charges in the first capacitor C1 are discharged to the voltage terminal V1.

The nth stage SRCn further includes a holding portion 106, a second discharging portion 107, and a switching portion 108. The holding portion 106 holds the nth gate output signal of the nth stage SRCn as the off voltage Voff; the second discharging portion 107 discharges the nth gate output signal to the voltage terminal V1 in response to the first clock CKV; and the switching portion 108 controls operation of the holding portion 106.

The holding portion 106 includes a fifth transistor NT5. A gate electrode of the fifth transistor NT5 is connected to a third node N3; a drain electrode of the fifth transistor NT5 is connected to the second node N2; and a source electrode of the fifth transistor NT5 is connected to the voltage terminal V1. The discharging portion 107 includes a sixth transistor NT6. A gate electrode of the sixth transistor NT6 is connected to the second clock terminal CK2; a drain electrode of the discharging portion 107 is connected to the second node N2; and a source electrode of the fifth transistor NT5 is connected to the voltage terminal V1.

The switching portion 108 includes seventh, eighth, ninth and tenth transistors NT7, NT8, NT9, and NT10, respectively, and second and third capacitors C2 and C3, respectively. Gate and drain electrodes of the seventh transistor NT7 are commonly connected to the fourth connecting wiring CL4 and a source electrode of the seventh transistor NT7 is connected to the third node N3. A drain electrode of the eighth transistor NT8 is connected to the fourth connecting wiring CL4; a gate electrode of the eighth transistor NT8 is connected to the fourth connecting wiring CL4 through the second capacitor C2; and a source electrode of the eighth transistor NT8 is connected to the third node N3. The third capacitor C3 comprises the gate and source electrodes of the eighth transistor NT8. The gate electrodes of the seventh and eighth transistors NT7 and NT8, respectively, receive the second clock CKVB from the second clock terminal CK2 of the (n−1)th stage SRC(n−1) through the fourth connecting wiring CL4.

A gate electrode of the ninth transistor NT9 is connected to the second node N2; a drain electrode of the ninth transistor NT9 is connected to the source electrode of the seventh transistor NT7; and a source electrode of the ninth transistor NT9 is connected to the voltage terminal V1. A gate electrode of the tenth transistor NT10 is connected to the second node N2; a drain electrode of the tenth transistor NT10 is connected to the third node N3; and a source electrode of the tenth transistor NT10 is connected to the voltage terminal V1.

When the seventh and eighth transistors NT7 and NT8, respectively, are turned on by the second clock CKVB and then the first clock CKV is outputted to the output terminal OUTn, the second node N2 is raised to a high level of the first clock CKV. At this time, since the ninth and tenth transistors NT9 and NT10, respectively, are turned on, the voltage outputted by the seventh and eighth transistors NT7 and NT8 is discharged to the voltage terminal V1 through the ninth and tenth transistors NT9 and NT10 being turned on. Accordingly, the third node N3 maintains a low level (e.g. an off voltage) and therefore the fifth transistor NT5 is turned off.

Then, when the nth gate output signal of the nth stage SRCn is discharged to the voltage terminal V1 in response to the (n+1)th gate output signal of the (n+1)th stage SRC(n+1), the voltage at the second node N2 is gradually decreased to a low level (e.g. an off voltage). Accordingly, the ninth and tenth transistors NT9 and NT10 are turned off and the voltage at the third node N3 is gradually increased in response to the voltages outputted from the seventh and eighth transistors NT7 and NT8. As the voltage at the third node N3 is gradually increased, the fifth transistor NT5 is turned on and therefore the voltage at the second node N2 is quickly discharged to the voltage terminal V1. At this time, when the sixth transistor NT6 is turned on in response to the first clock CKV supplied from the second clock terminal CK2, the voltage at the second node N2 is also discharged to the voltage terminal V1.

Meanwhile, the nth stage SRCn further includes a ripple prevention portion 109 and a reset portion 110. The ripple prevention portion 109 includes the eleventh and twelfth transistors NT11 and NT12, respectively. A gate electrode of the eleventh transistor NT11 is connected to the fourth connecting wiring CL4; a drain electrode of the eleventh transistor NT11 is connected to the source electrode of the twelfth transistor NT12; and a source electrode of the eleventh transistor NT11 is connected to the second node N2. A gate electrode of the twelfth transistor NT12 is connected to the second clock terminal CK2; a drain electrode of the twelfth transistor NT12 is connected to the first input terminal IN2; and a source electrode of the twelfth transistor NT12 is connected to the drain electrode of the eleventh transistor NT11. Accordingly, the ripple prevention portion 109 prevents rippling by the first and second clocks CK1 and CK2 after the nth gate output signal is discharged to the voltage terminal V1.

The reset portion 110 includes a thirteenth transistor NT13. A gate electrode of the thirteenth transistor NT13 is connected to the reset terminal RE; a drain electrode of the thirteenth transistor is connected to the first node N1; and a source electrode of the thirteenth transistor is connected to the voltage terminal V1. When the (n+1)th gate output signal of the (n+1)th stage SRC(n+1) is outputted to the reset terminal RE, the thirteenth transistor NT13 is turned on and therefore the voltage at the first node N1 is discharged to the voltage terminal V1. Accordingly, the nth gate output signal of the nth stage SRCn is discharged further closely to the voltage level Voff of the voltage terminal V1 by the (n+1)th gate output signal of the (n+1)th stage SRC(n+1).

The (n+1)th stage SRC(n+1) substantially has the same configuration as the nth stage SRCn. However, in the (n+1)th stage SRC(n+1), the first transistor NT1 of the pull-up portion 101 is electrically connected to the second clock terminal CK2 of the nth stage SRCn through the third connecting wiring CL3. Accordingly, the drain electrode of the first transistor NT1 receives the first clock CKV from the nth stage SRCn through the third connecting wiring CL3. Further, the seventh and eighth transistors NT7 and NT8 in the switching portion 108 of the (n+1)th stage SRC(n+1) are electrically connected to the second clock terminal CK2 of the nth stage SRCn through the third connecting wiring CL3.

Figure 4:
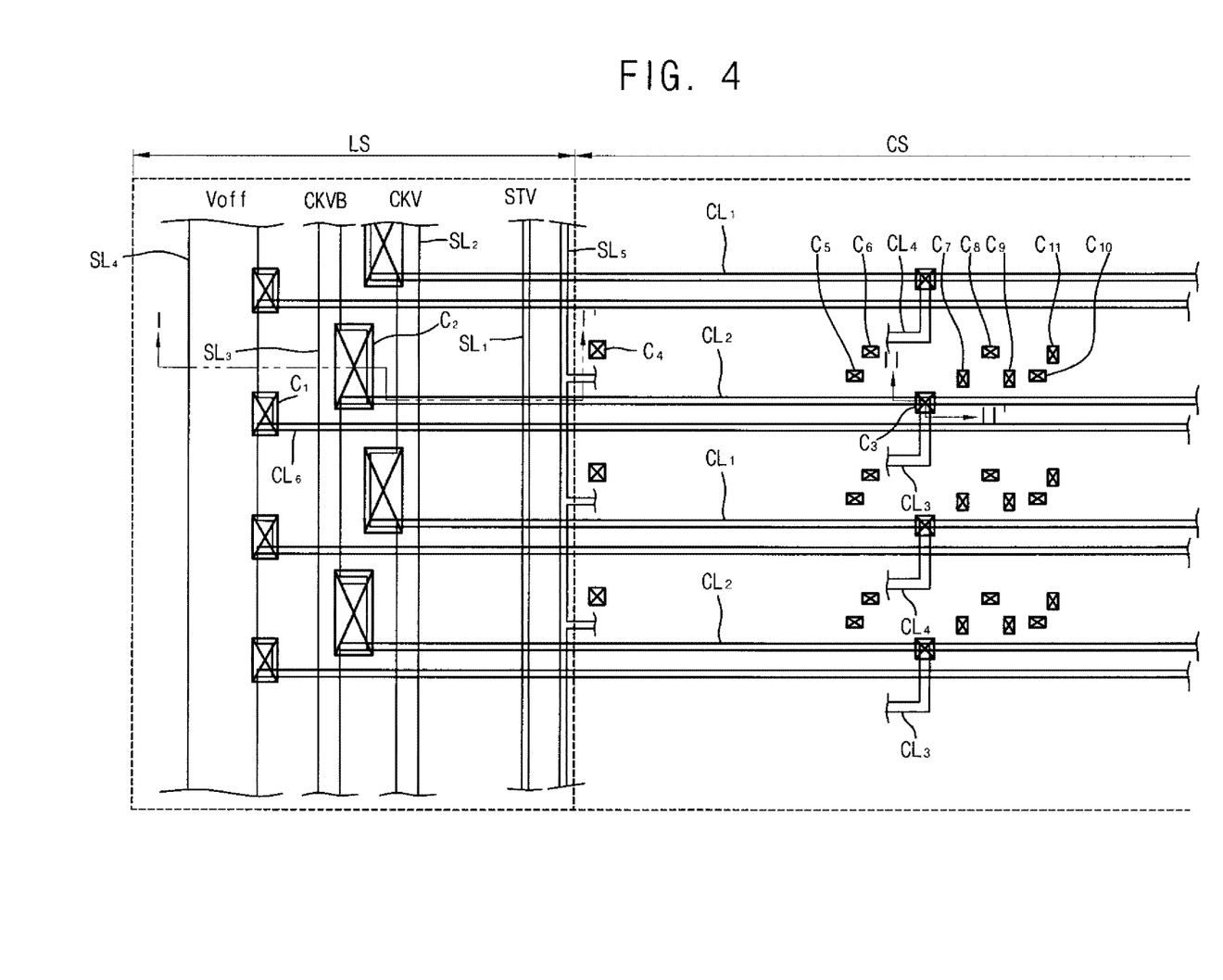
FIG. 4 is a layout diagram of the gate driver in FIG. 2.
Figure 5:
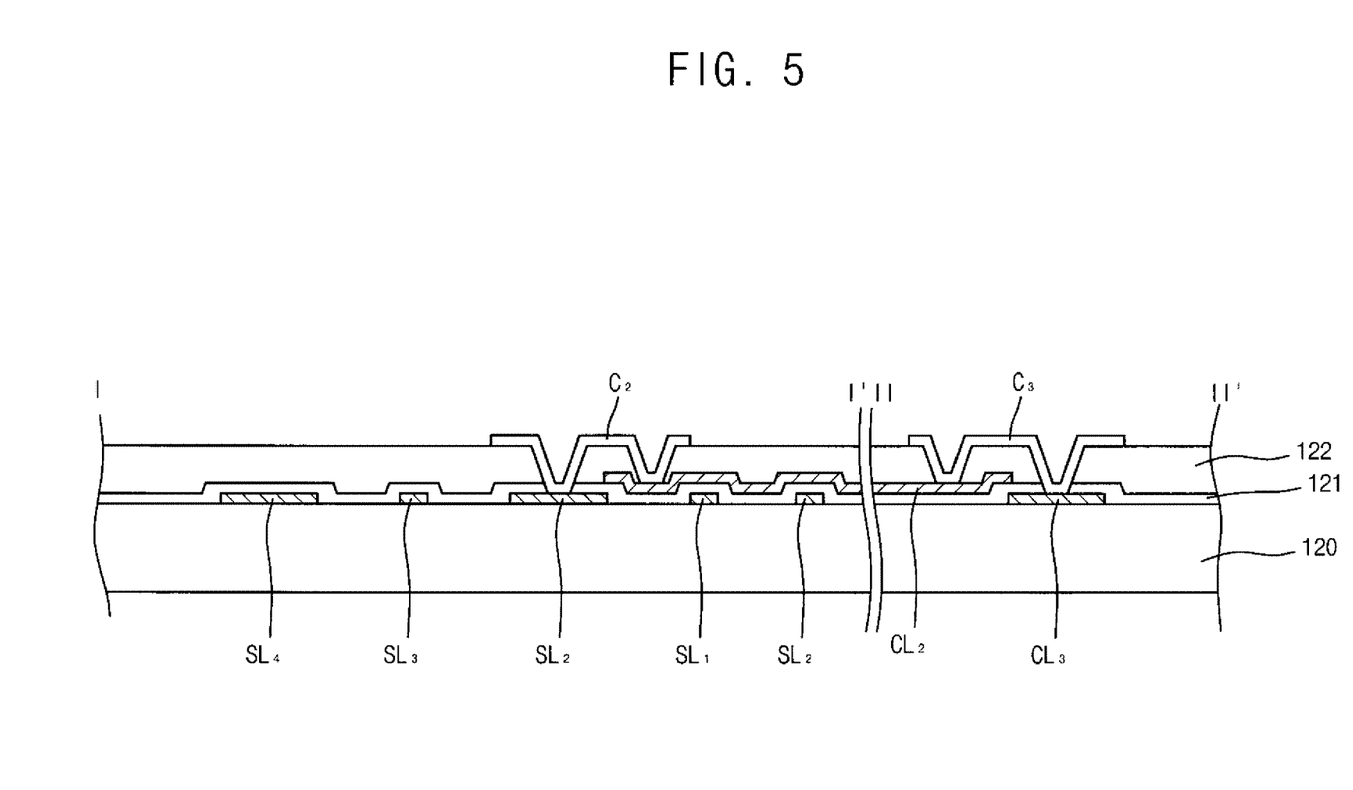
FIG. 5 is a cross-sectional view taken along line 4-4 in FIG. 4.

FIG. 4 is a layout diagram of the gate driver in FIG. 1, and FIG. 5 is a cross-sectional view taken along line 4-4 in FIG. 4. Referring to FIGS. 4 and 5, the gate driver 100 includes the wiring portion LS and the circuit portion CS. The wiring portion LS includes the start signal wiring SL1, the first and second clock wirings SL2 and SL3, respectively, the off voltage wiring SL4, the reset wiring SL5, and the third and fourth connecting wirings CL3 and CL4, respectively. The start signal wiring SL1, the first and second clock wirings SL2 and SL3, the off voltage wiring SL4, the reset wiring SL5 and the third and fourth connecting wirings CL3 and CL4 are made of a first metal and formed in a first layer on the substrate 120. Further, the wiring portion LS includes the first and second connecting wirings CL1 and CL2, respectively, and the sixth connecting wiring CL6. The first and second connecting wirings CL1 and CL2 and the sixth connecting wiring CL6 are made of a second metal and formed in a second layer on the substrate 120. In this embodiment, the first metal may include aluminum or aluminum alloy, for example, and the second metal may include Cr, for example.

As shown in FIG. 4, the gate insulating layer 121 is formed on the substrate 120 and covers the entire surfaces of the start signal wiring SL1, the first and second clock wirings SL2 and SL3 respectively, the off voltage wiring SL4, the reset wiring SL5, and the third and fourth connecting wirings CL3 and CL4, respectively. The first and second connecting wirings CL1 and CL2 and the sixth connecting wiring CL6 are formed on the gate insulating layer 121. The passivation layer 122 is formed on the substrate 120 and covers the entire surfaces of the first and second connecting wirings CL1 and CL2 and the sixth connecting wiring CL6.

In each of the odd-numbered stages SRC1, SRC3, . . . , SRC(n+1), the wiring portion LS includes the first, second and third contact electrodes C1, C2 and C3, respectively, and the circuit portion CS includes the fourth, fifth, sixth, seventh, eighth, ninth, tenth and eleventh contact electrodes C4, C5, C6, C7, C8, C9, C10 and C11, respectively. The first contact electrode C1 electrically connects the off voltage wiring SL4 with the sixth connecting wiring CL6; the second contact electrode C2 electrically connects the second clock wiring SL3 with the second connecting wiring CL2; and the third contact electrode C3 electrically connects the second connecting wiring CL2 with the third connecting wiring CL3. The fourth to eleventh contact electrodes C4 to C11, respectively, in the circuit portion CS connect the first to thirteenth transistors NT1 to NT13, respectively, in each of the odd-numbered stages SRC1, SRC3, . . . , SRC(n+1) to each other. In each of the odd-numbered stages SRC1, SRC3, . . . , SRC(n+1), the number of the contact electrodes in the circuit portion CS is 11 in total.

Meanwhile, in each of the even-numbered stages SRC2, SRC4, . . . , SRCn, the second contact electrode C2 in the wiring portion LS electrically connects the first clock wiring SL2 with the first connecting wiring CL1, and the third contact electrode C3 electrically connects the first connecting wiring CL1 with the fourth connecting wiring CL4. The fourth to eleventh contact electrodes C4 to C11 in the circuit portion CS connect the first to thirteenth transistors NT1 to NT13, respectively, in each of the even-numbered stages SRC2, SRC4, . . . , SRCn. In each of the even-numbered stages SRC2, SRC4, . . . , SRCn, the number of the contact electrodes in the circuit portion CS is 11 in total.

Referring back to FIG. 1, the number of the contact electrodes in the conventional gate driver is 12 for each stage, while the number of the contact electrodes of the gate driver 100 in this exemplary embodiment is 11 for each stage. Accordingly, reducing one contact electrode in each stage may prevent the gate driver from erroneously operating because of erosion of the contact electrodes. Further, since the number of the connecting wirings for electrically connecting the first and second clock wirings SL2 and SL3, respectively, with the circuit portion CS is reduced, the parasitic capacitance Cp between the connecting wiring and the first and second clock wirings SL2 and SL3 may be reduced, and therefore, reduce the consumed power P of a display device.

Figure 6:
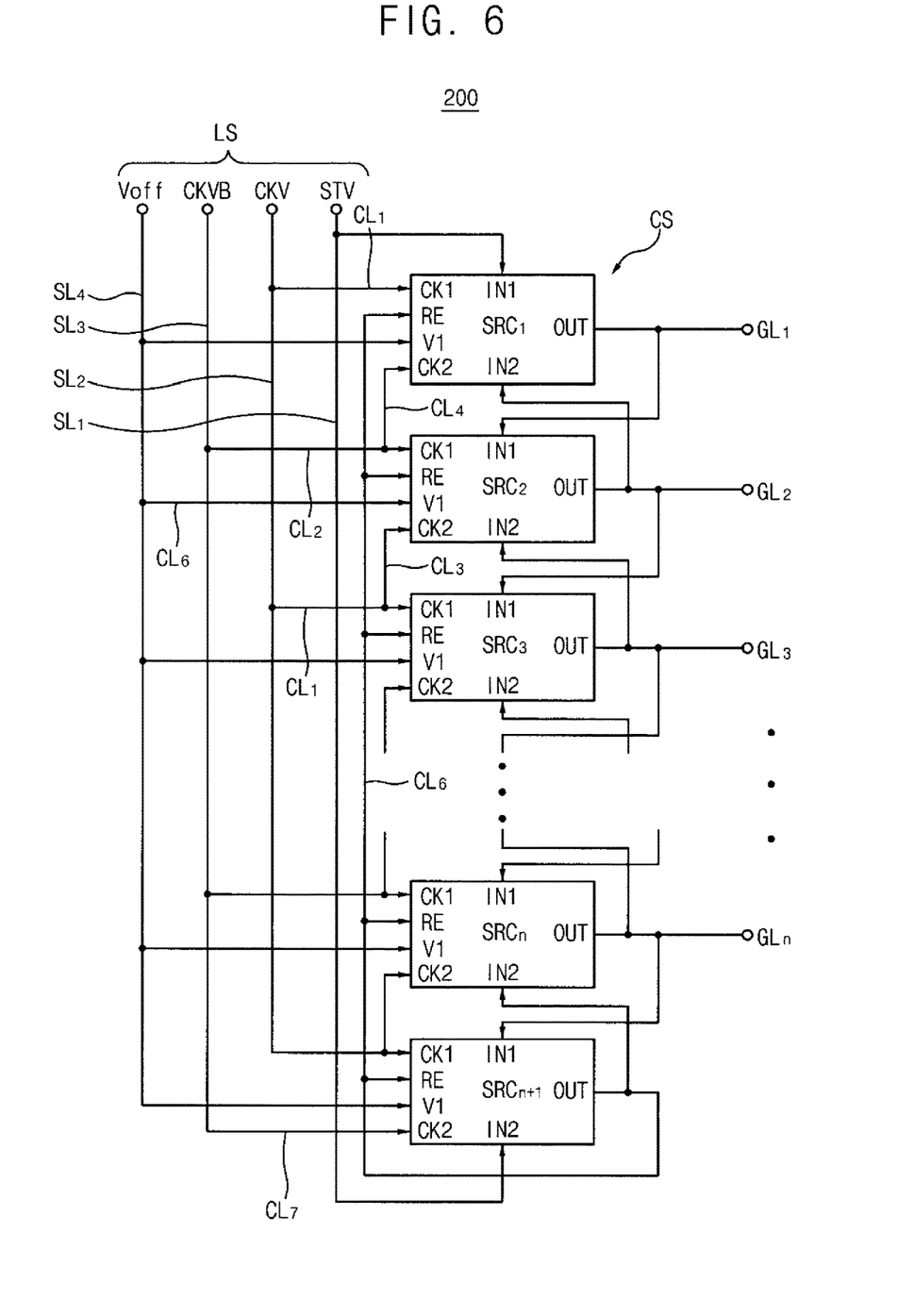
FIG. 6 is a block diagram of the gate driver according to another exemplary embodiment.

FIG. 6 is a block diagram of a gate driver according to another exemplary embodiment. Herein, the same parts as those shown in FIG. 2 are represented with like reference numerals and their explanation will be omitted to avoid description duplication.

Referring to FIG. 6, the gate driver 200 includes a circuit portion CS1 outputting gate output signals and a wiring portion LS1 delivering control signals to the circuit portion CS1. The circuit portion CS1 includes first to (n+1)th stages SRC1 to SRC(n+1), respectively, connected to each other. Herein, n is an even number.

The wiring portion LS1 is formed near the circuit portion CS1 and delivers control signals from an outside device (not shown). The wiring portion LS1 includes a start signal wiring SL1, a first clock wiring SL2, a second clock wiring SL3, an off voltage wiring SL4, and a reset wiring SL5. The wiring portion LS1 further includes first, second, third, and fourth connecting wirings CL1, CL2, CL3 and CL4, respectively.

The first connecting wiring CL1 electrically connects the first clock wiring SL2 with the first clock terminal CK1 in each of the odd-numbered stages SRC1, SRC3, . . . , SRC(n+1). The second connecting wiring CL2 electrically connects the second clock wiring SL3 with the second clock terminal CK2 in each of the even-numbered stages SRC2, SRC4, . . . , SRCn. The third connecting wiring CL3 electrically connects each of the odd-numbered stages SRC3, SRC5, . . . , SRC(n+1) with the first connecting wirings CL1 in each of the even-numbered stages SRC2, SRC4, . . . , SRCn. In detail, each third connecting wiring CL3 electrically connects the first connecting wirings CL1 with the second clock terminals CK2 of the even-numbered stages SRC2, SRC4, . . . , SRCn. Accordingly, the first clock CKV is inputted to the second clock terminal CK2 of each of the even-numbered stages SRC2, SRC4, . . . , SRCn through the third connecting wiring CL3. The fourth connecting wiring CL4 electrically connects each of the even-numbered stages SRC2, SRC4, . . . , SRCn connected to the second connecting wiring CL2 with each of the odd-numbered stages SRC1, SRC3, . . . , SRC(n+1). In detail, each fourth connecting wiring CL4 electrically connects the second connecting wirings CL2 with the second clock terminal CK2 of the odd-numbered stages SRC1, SRC3, . . . , SRC(n+1). Accordingly, the second clock CKVB is inputted to the second clock terminal CK2 of the odd-numbered stages SRC1, SRC3, . . . , SRC(n+1) through the fourth connecting wiring CL4.

Meanwhile, the wiring portion LS1 further includes fifth connecting wirings CL5. The fifth connecting wiring CL5 electrically connects the second clock terminal CK2 of the (n+1)th stage SRC(n+1) with the second clock wiring SL3. Further, the wiring portion LS1 includes sixth connecting wirings CL6. The sixth connecting wirings CL6 deliver the off voltage Voff to the voltage terminals V1 of each of the first, second, . . . , (n+1)th stages.

Figure 7:
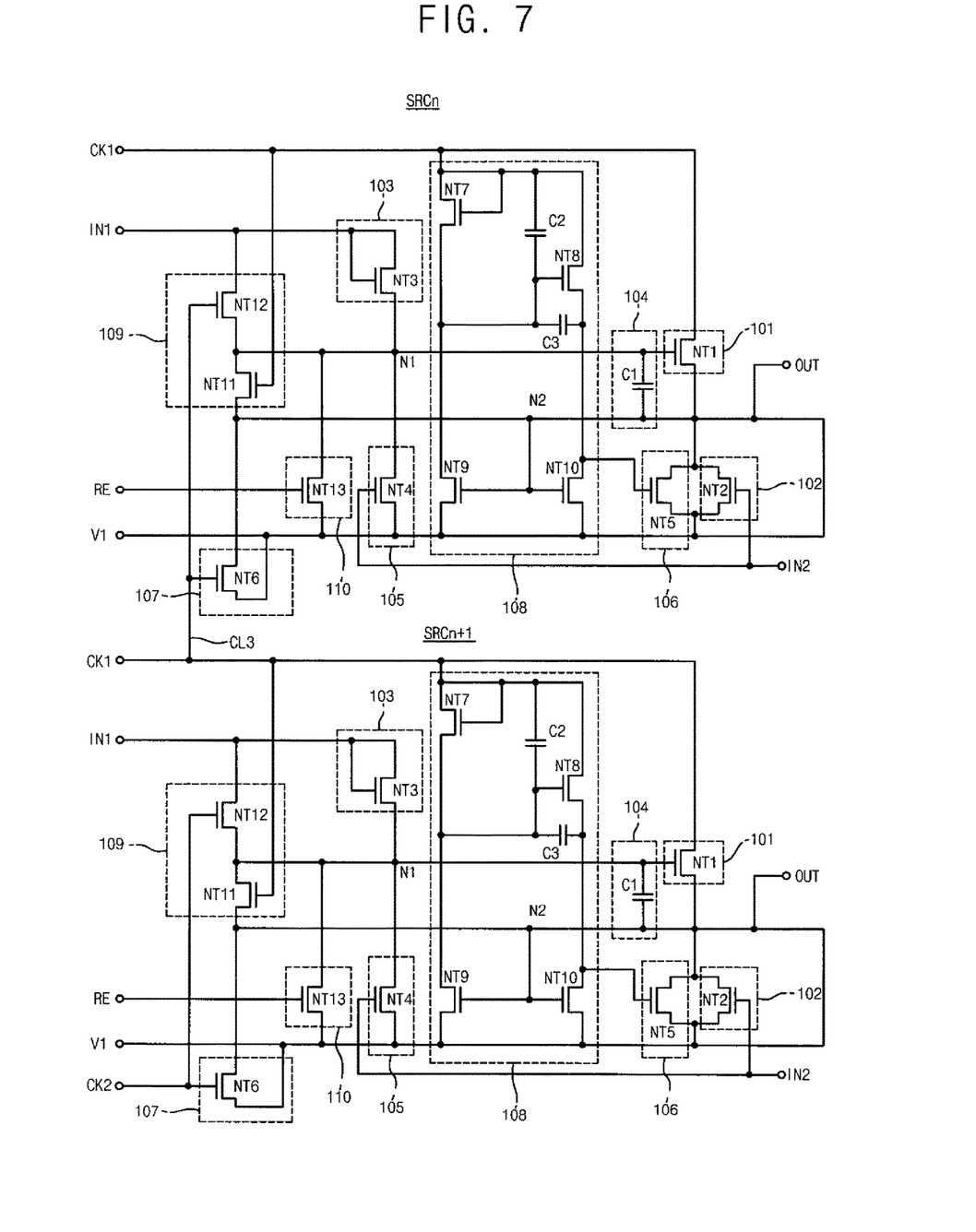
FIG. 7 is a circuit diagram of the nth and (n+1)th stages in FIG. 6.

FIG. 7 is a circuit diagram of the nth and (n+1)th stages in FIG. 6. Referring to FIG. 7, the nth stage SRCn includes a pull-up portion 201 pulling up the nth gate output signal of the nth stage SRCn to the second clock CKVB, and a pull-down portion 202 pulling down the nth gate output signal of the nth stage SRCn pulled up in response to the (n+1)th gate output signal of the (n+1)th stage SRC(n+1).

The pull-up portion 201 includes a first transistor NT1. A gate electrode of the first transistor NT1 is connected to a first node N1; a drain electrode of the first transistor NT1 is connected to the first clock CK1; and a source electrode of the first transistor NT1 is connected to the output terminal OUTn. The pull-down portion 202 includes a second transistor NT2. A gate electrode of the second transistor NT2 is connected to the second input terminal IN2; a drain electrode of the second transistor NT2 is connected to the output terminal OUTn; and a source electrode of the second transistor NT2 is connected to the voltage terminal V1.

The nth stage SRCn further includes a pull-up driving portion which turns on the pull-up portion 201 in response to the (n−1)th gate output signal of the (n−1)th stage SRC(n−1) and turns off the pull-up portion 201 in response to the (n+1)th gate output signal of the (n+1)th stage SRC(n+1).

The pull-up driving portion includes a buffer portion 203, a charging portion 204 and a first discharging portion 205. The buffer portion 203 includes a third transistor NT3. Gate and drain electrodes of the third transistor NT3 are commonly connected to the first input terminal IN1 and a source electrode of the third transistor NT3 is connected to the first node N1. The charging portion 204 includes a first capacitor C1. A first electrode of the first capacitor C1 is connected to the first node N1 and a second electrode of the first capacitor C1 is connected to the second node N2. The first discharging portion 205 includes a fourth transistor NT4. A gate electrode of the fourth transistor NT4 is connected to the second input terminal IN2; a drain electrode of the fourth transistor NT4 is connected to the first node N1; and a source electrode of the fourth transistor NT4 is connected to the voltage terminal V1.

The nth stage SRCn further includes a holding portion 206, a second discharging portion 207, and a switching portion 208.

The holding portion 206 holds the nth gate output signal of the nth stage SRCn as an off voltage Voff; the second discharging portion 207 discharges the nth gate output signal of the nth stage SRCn to the voltage terminal V1; and the switching portion 208 controls operation of the holding portion 206. The holding portion 206 includes a fifth transistor NT5. A gate electrode of the fifth transistor NT5 is connected to the third node N3; a drain electrode of the fifth transistor NT5 is connected to the second node N2; and a source electrode of the fifth transistor NT5 is connected to the voltage terminal V1. The discharging portion 207 includes a sixth transistor NT6. A gate electrode of the sixth transistor NT6 is connected to the third connecting wiring CL3; a drain electrode of the sixth transistor NT6 is connected to the second node N2; and a source electrode of the sixth transistor NT6 is connected to the voltage terminal V1. Accordingly, the gate electrode of the discharging portion 207 receives the first clock CKV from the (n+1)th stage SRC(n+1) through the third connecting wiring CL3.

The switching portion 208 includes seventh, eighth, ninth and tenth transistors NT7, NT8, NT9 and NT10, respectively, and the second and third capacitors C2 and C3, respectively. The gate and drain electrodes of the seventh transistor NT7 are connected to the first clock terminal CK1 and the source electrode of the seventh transistor NT7 is connected to the third node N3. The drain electrode of the eighth transistor NT8 is connected to the first clock terminal CK1; the gate electrode of the eighth transistor NT8 is connected to the first clock terminal CK1 through the second capacitor C2; and the source electrode of the eighth transistor NT8 is connected to the third electrode N3. The third capacitor C3 comprises the gate and source electrodes of the eighth transistor NT8. The gate electrode of the ninth transistor NT9 is connected to the second node N2; the drain electrode of the ninth transistor NT9 is connected to the source electrode of the seventh transistor NT7; and the source electrode of the ninth transistor NT9 is connected to the voltage terminal V1. A gate electrode of the tenth transistor NT10 is connected to the second node; a drain electrode of the tenth transistor NT10 is connected to the third node N3; and a source electrode of the tenth transistor NT10 is connected to the voltage terminal V1.

Meanwhile, the nth stage SRCn further includes a ripple prevention portion 209 and a reset portion 210. The ripple prevention portion 209 includes eleventh and twelfth transistors NT11 and NT12. A gate electrode of the eleventh transistor NT11 is connected to the first clock terminal CK1; a drain electrode of the eleventh transistor NT11 is connected to the source electrode of the twelfth transistor NT12; and a source electrode of the eleventh transistor NT11 is connected to the second node N2. A gate electrode of the twelfth transistor NT12 is connected to the third connecting wiring CL3; a drain electrode of the twelfth transistor NT12 is connected to the first input terminal IN2; and a source electrode of the twelfth transistor NT12 is connected to the drain electrode of the eleventh transistor NT11. Accordingly, the gate electrode of the twelfth transistor NT12 receives the first clock CKV from the (n+1)th stage SRC(n+1) through the third connecting wiring CL3.

The reset portion 210 includes a thirteenth transistor NT13. A gate electrode of the thirteenth transistor NT13 is connected to the reset terminal RE; a drain electrode of the thirteenth transistor NT13 is connected to the first node N1; and a source electrode of the thirteenth transistor NT13 is connected to the voltage terminal V1.

The (n+1)th stage SRC(n+1) substantially has the same configuration as the nth stage SRCn. However, in the (n+1)th stage SRC(n+1), the first clock CKV inputted from the first clock terminal CK1 of the (n+1)th stage SRC(n+1) is sent to the nth stage SRCn through the third connecting wiring CL3. In detail, the third connecting wiring CL3 is electrically connected to the gate electrode of the sixth transistor NT6 in the second discharging portion 207 and the gate electrode of the twelfth transistor NT12 in the ripple prevention portion 209 and therefore delivers the first clock CKV.

Figure 8:
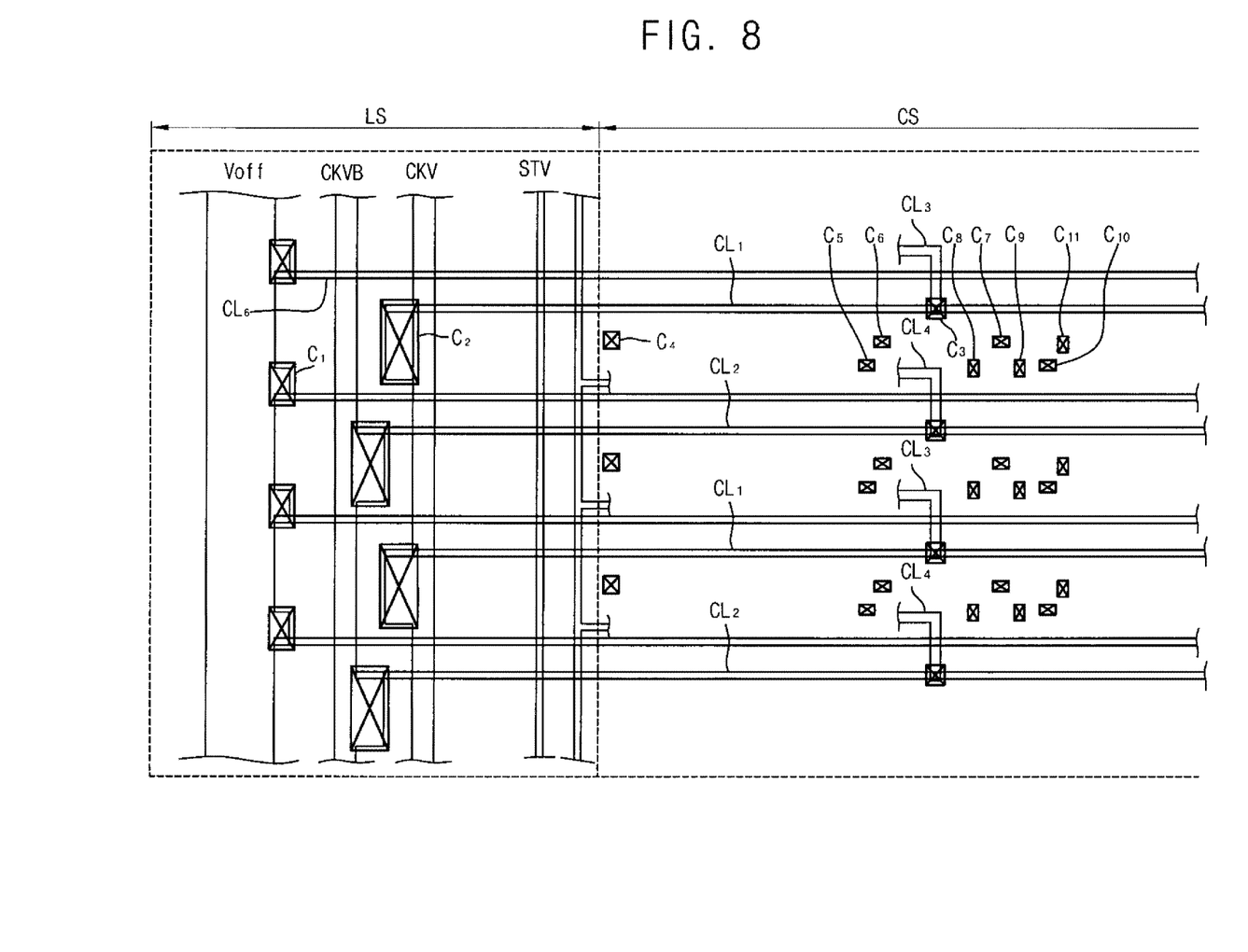
FIG. 8 is a layout diagram of the gate driver in FIG. 6.

FIG. 8 is a layout diagram of the gate driver in FIG. 6. Referring to FIG. 8, the gate driver 200 includes the wiring portion LS1 and the circuit portion CS1. The wiring portion LS1 includes the start signal wiring SL1, the first and second clock wirings SL2 and SL3, respectively, the off voltage wiring SL4, the reset wiring SL5, and the third and fourth connecting wirings CL3 and CL4, respectively. The start signal wiring SL1, the first and second clock wirings SL2 and SL3, the off voltage wiring SL4, the reset wiring SL5 and the third and fourth connecting wirings CL3 and CL4 is made of a first metal. Further, the wiring portion LS1 includes the first and second connecting wirings CL1 and CL2, respectively, and the sixth connecting wiring CL6 which are made of a second metal.

In each of the odd-numbered stages SRC1, SRC3, . . . , SRC(n+1), the wiring portion LS1 has first, second, and third contact electrodes C1, C2 and C3, respectively, and the circuit portion CS1 has fourth, fifth, sixth, seventh, eighth, ninth, tenth and eleventh contact electrodes C4, C5, C6, C7, C8, C9, C10 and C11, respectively.

The first contact electrode C1 electrically connects the off voltage wiring SL4 with the sixth connecting wiring CL6, and the second contact electrode C2 is electrically connects the second clock wiring SL3 with the second connecting wiring CL2, and the third contact electrode C3 electrically connects the second clock wiring SL2 with the third connecting wiring CL3. The fourth to eleventh contact electrodes C4 to C11, respectively, in the circuit portion CS1 connect the first to thirteenth transistors NT1 to NT13, respectively, in each of the odd-numbered stages SRC1, SRC3, . . . , SRC(n+1). In each of the odd-numbered stages SRC1, SRC3, . . . , SRC(n+1), the number of the contact electrodes in the circuit portion CS1 is 11 in total.

Meanwhile, in the even-numbered stages SRC2, SRC4, . . . , SRCn, the second contact electrode C2 in the wiring portion LS1 electrically connects the first clock wiring SL2 with the first connecting wiring CL2, and the third contact electrode C3 electrically connects the first connecting wiring CL1 with the third connecting wiring CL3. The fourth to eleventh contact electrodes C4 to C11 in the circuit portion CS1 connect the first to thirteenth transistors NT1 to NT13, respectively, in each of the even-numbered stages SRC2, SRC4, . . . , SRCn. In each of the even-numbered stages SRC2, SRC4, . . . , SRCn, the number of the contact electrodes in the circuit portion CS1 is 11 in total.

Referring back to FIG. 1, the number of the contact electrodes in the conventional gate driver is 12 in each stage, while the number of the contact electrodes of the gate driver 200 in this exemplary embodiment is 11 in each stage. Accordingly, reducing one contact electrode in each stage may prevent the gate driver 200 from erroneously operating because of erosion of the contact electrodes. Further, since the number of the contact electrodes is reduced, the second contact electrode C2 formed on the gate driver 200 may be formed larger and therefore reduce contact resistances in total. Accordingly, this may prevent the first and second clocks CKV and CKVB, respectively, from deteriorating by the contact resistances. Since the number of the connecting wirings for electrically connecting the first and second clock wirings SL2 and SL3, respectively, with the circuit portion CS1 is reduced, the parasitic capacitance Cp between the connecting wiring and the first and second clock wirings SL2 and SL3 may be reduced and therefore reduce the consumed power P of a display device.

Figure 9:
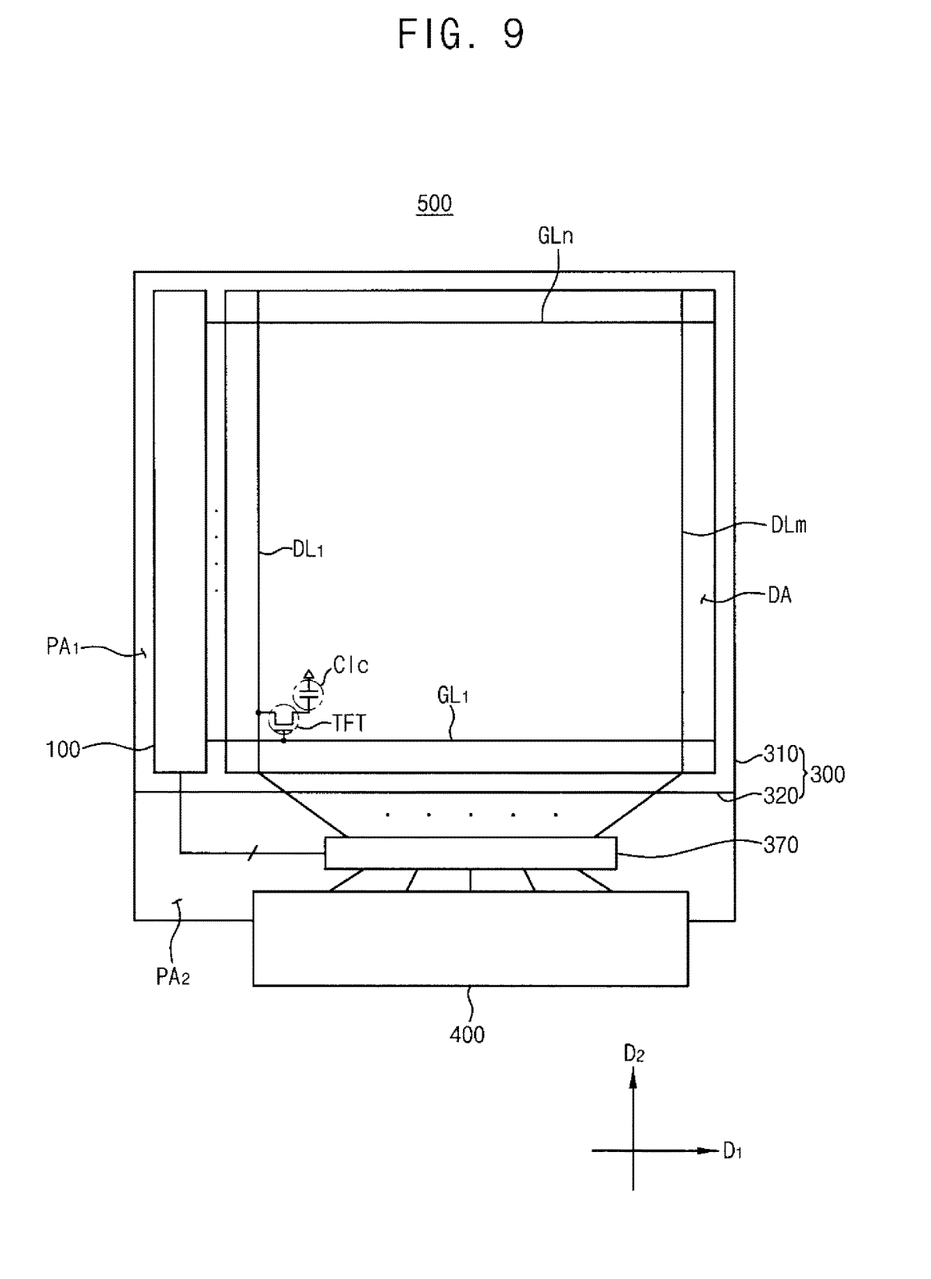
FIG. 9 is a plan view of a display device according to another exemplary embodiment.

FIG. 9 is a plane view of a display device according to another exemplary embodiment. Referring to FIG. 9, a display device 500 includes a display panel 300 having a first display substrate 310, a second display substrate facing the first display substrate 320, and a liquid crystal layer (not shown) disposed between the first and second display substrates 310 and 320.

The first display substrate 310 includes a display area DA and first and second peripheral areas PA1 and PA2, respectively, adjacent to the display area DA. The display area DA of the display device 500 includes pixel areas having gate lines GL1 to GLn extending in the first direction D1, and data lines DL1 to DLm extending in the second direction D2 perpendicular to the first direction D1 and intersecting the gate lines GL1 to GLn.

Each pixel area includes a thin film transistor 110 (hereinafter, referred to as "TFT") and a liquid crystal capacitor Clc connected to the TFT. A gate electrode of the TFT 110 is connected to a corresponding gate line; a source electrode of the TFT 110 is connected to a corresponding data line; and a drain electrode of the TFT 110 is connected to the liquid crystal capacitor Clc.

The first peripheral area PA1 is adjacent to one end of the gate lines GL1 to GLn and the second peripheral area PA2 is adjacent to one end of the data lines DL1 to DLm. The first peripheral area PA1 includes a gate driver 100 outputting gate output signals to the gate lines GL1 to GLn. The second peripheral area PA2 includes a data driver 370 outputting data signals to the data lines DL1 to DLm. A flexible printed circuit board 400 (hereinafter, referred to as "FPC") electrically connecting an external device (not shown) with the display panel 300 is affixed to one end of the second peripheral area PA2. The FPC 400 is electrically connected to the data driver 370. The gate driver 100 is connected to the FPC 400 through the data driver 370 or directly connected to the FPC 400.

In the above disclosed exemplary embodiments, reducing one contact electrode in each stage may prevent the gate driver 200 from erroneously operating due to erosion of the contact electrodes. Further, since the number of the connecting wirings is reduced, the parasitic capacitance Cp between the connecting wiring and the clock wirings may be reduced and therefore reduce the consumed power P of the display device.

Having described the embodiments of the present invention and its advantages, it should be noted that various changes, substitutions and alterations can be made herein without departing from the spirit and scope of the invention as defined by appended claims.

What is claimed is:

1. A driving unit comprising:
 a circuit portion, the circuit portion comprises a plurality of stages comprising a first every other stage and a second every other stage different from the first every other stage, the plurality of stages generate output signals according to at least one of first and second clocks; and
 a wiring portion, the wiring portion delivers control signals to the circuit portion, the wiring portion comprises:
  first and second clock wirings, the first and second clock wirings deliver the first and second clock, respectively;
  first connecting wirings, the first connecting wirings connect the first clock wiring with the first every other stage;
  second connecting wirings, the second connecting wirings connect the second clock wiring with the second every other stage;
  third connecting wirings, the third connecting wirings extend independent of first clock wiring and directly connect the first connecting wiring with the plurality of stages; and
  fourth connecting wirings, the fourth connecting wirings extend independent of the second clock wiring and directly connect the second connecting wiring with the plurality of stages, wherein the first connecting wirings connect the first clock wiring with even-numbered stages of the plurality of stages, and the second connecting wirings connect the second clock wiring with odd-numbered stages of the plurality of stages.

2. The driving unit of claim 1, wherein the third connecting wirings connect the first clock connecting wiring with the odd-numbered stages, and the fourth connecting wirings connect the second clock connecting wiring with the even-numbered stages.

3. The driving unit of claim 2, wherein the wiring portion further comprises a fifth connecting wiring, the fifth connecting wiring connects the first clock wiring with a first clock terminal of a first stage.

4. The driving unit of claim 3, wherein the wiring portion further comprises a reset wiring and sixth connecting wirings, the reset wiring delivers an output signal of a last stage to reset terminals of the even-numbered or odd-numbered stages and the sixth connecting wirings deliver an off voltage to voltage terminals of the stages.

5. The driving unit of claim 4, wherein the wiring portion further comprises a start signal wiring, the start signal wiring delivers a vertical synchronization start signal to a first stage and the last stage.

6. The driving unit of claim 5, wherein the odd-numbered stages comprise a first driving portion and a first discharging portion, the first driving portion generates output signals according to the first clock, and the first discharging portion discharges output signals according to the second clock; and
 the even-numbered stages comprise a second driving portion and a second discharging portion, the second driving portion generates output signals according to the second clock, and the second discharging portion discharges output signals according to the first clock.

7. The driving unit of claim 6, wherein the first driving portion is electrically connected to the second discharging portion of a previous stage and receives the first clock through the third connecting wiring; and
 the second driving portion is electrically connected to the first discharging portion of the previous stage and receives the second clock through the fourth connecting wiring.

8. The driving unit of claim 7, wherein the first driving portion comprises
 a pull-up portion, the pull-up portion receives the first clock through the third connecting wiring and converts an output signal of a current stage into the first clock;
 a pull-down portion, the pull-down portion discharges the output signal of the current stage to an off voltage according to a following output signal of a following stage;
 a pull-up driving portion, the pull-up driving portion turns on the pull-up portion according to a previous output signal of the previous stage and turns off the pull-down portion according to the following output signal of the following stage;
 a holding portion, the holding portion holds the output signal of the current stage; and
 a switching portion, the switching portion controls the holding portion.

* * * * *